US008040750B2

(12) United States Patent  
Cagno et al.

(10) Patent No.: US 8,040,750 B2
(45) Date of Patent: Oct. 18, 2011

(54) DUAL MODE MEMORY SYSTEM FOR REDUCING POWER REQUIREMENTS DURING MEMORY BACKUP TRANSITION

(75) Inventors: Brian J. Cagno, Tucson, AZ (US); John C. Elliott, Tucson, AZ (US); Gregg S. Lucas, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 12/145,969

(22) Filed: Jun. 25, 2008

(65) Prior Publication Data

US 2009/0323452 A1 Dec. 31, 2009

(51) Int. Cl.
G11C 5/14 (2006.01)
(52) U.S. Cl. ........................................ 365/228
(58) Field of Classification Search .................. 365/228, 365/229, 227, 226
See application file for complete search history.

(56) References Cited

U.S. PATENT DOCUMENTS

| | | | |
|---|---|---|---|
| 4,974,118 A | 11/1990 | Rounds | |
| 5,262,999 A * | 11/1993 | Etoh et al. ................. | 365/226 |
| 5,430,674 A | 7/1995 | Javanifard | |
| 5,438,549 A | 8/1995 | Levy | |
| 5,555,371 A | 9/1996 | Duyanovich et al. | |
| 5,644,531 A | 7/1997 | Kuo et al. | |
| 5,661,349 A | 8/1997 | Luck | |
| 5,732,238 A | 3/1998 | Sarkozy | |
| 5,793,776 A * | 8/1998 | Qureshi et al. ............ | 714/724 |
| 5,944,837 A | 8/1999 | Talreja et al. | |
| 6,016,472 A | 1/2000 | Ali | |
| 6,236,593 B1 | 5/2001 | Hong et al. | |
| 6,282,670 B1 | 8/2001 | Rezaul Islam et al. | |
| 6,378,033 B1 | 4/2002 | Nishikawa | |
| 6,496,939 B2 * | 12/2002 | Portman et al. ............ | 713/340 |
| 6,658,435 B1 | 12/2003 | McCall | |
| 6,680,548 B2 | 1/2004 | Shiue et al. | |
| 6,785,786 B1 | 8/2004 | Gold et al. | |
| 7,143,298 B2 | 11/2006 | Wells et al. | |
| 7,315,951 B2 | 1/2008 | Hanrieder et al. | |
| 7,451,348 B2 | 11/2008 | Pecone et al. | |
| 2002/0029354 A1 | 3/2002 | Forehand et al. | |

(Continued)

FOREIGN PATENT DOCUMENTS

JP 2000194607 A 7/2000

(Continued)

OTHER PUBLICATIONS

U.S. Appl. No. 12/146,098, filed Jun. 25, 2008, Cagno, et al.

(Continued)

Primary Examiner — Anh Phung
Assistant Examiner — Douglas King
(74) Attorney, Agent, or Firm — Stephen J. Walder, Jr.; Randall J. Bluestone

(57) ABSTRACT

A controller of a memory system is configured to reduce power requirements during memory backup transition. When transitioning to backup mode, the memory system controller performs a number of power saving techniques. The controller may change a number of configuration settings in the volatile memory system, such as reducing output driver strength, increasing differential impedance, increasing on-die termination, disabling receiver input circuitry, and disconnecting the termination voltage network. The controller may also assert a hard reset to the storage controller system to significantly reduce the load and allow the voltage regulator to continue to provide power to the memory system for a longer period of time.

20 Claims, 4 Drawing Sheets

U.S. PATENT DOCUMENTS

| | | | |
|---|---|---|---|
| 2004/0052502 A1 | 3/2004 | Komatsu et al. | |
| 2004/0218434 A1* | 11/2004 | Hwang et al. | 365/200 |
| 2004/0224192 A1 | 11/2004 | Pearson | |
| 2005/0010838 A1 | 1/2005 | Davies et al. | |
| 2005/0063217 A1* | 3/2005 | Shiraishi et al. | 365/154 |
| 2005/0283648 A1 | 12/2005 | Ashmore | |
| 2006/0047985 A1 | 3/2006 | Otani | |
| 2006/0108875 A1 | 5/2006 | Grundmann et al. | |
| 2006/0212644 A1* | 9/2006 | Acton et al. | 711/103 |
| 2006/0248269 A1 | 11/2006 | Shona | |
| 2006/0255746 A1 | 11/2006 | Kumar et al. | |
| 2006/0259756 A1 | 11/2006 | Thompson et al. | |
| 2006/0264188 A1 | 11/2006 | Mars et al. | |
| 2007/0002675 A1* | 1/2007 | Koo | 365/233 |
| 2007/0033433 A1* | 2/2007 | Pecone et al. | 714/6 |
| 2007/0133277 A1 | 6/2007 | Kawai et al. | |
| 2007/0180184 A1 | 8/2007 | Sakashita et al. | |
| 2008/0016385 A1 | 1/2008 | Hollingsworth et al. | |
| 2008/0086615 A1* | 4/2008 | Elliott et al. | 711/165 |
| 2008/0201622 A1 | 8/2008 | Hiew et al. | |
| 2009/0254772 A1 | 10/2009 | Cagno et al. | |
| 2009/0327578 A1 | 12/2009 | Cagno et al. | |
| 2010/0011261 A1 | 1/2010 | Cagno et al. | |
| 2010/0052625 A1 | 3/2010 | Cagno et al. | |

FOREIGN PATENT DOCUMENTS

| | | |
|---|---|---|
| JP | 2002312250 A | 10/2002 |

OTHER PUBLICATIONS

U.S. Appl. No. 12/204,456, filed Sep. 4, 2008, Cagno, et al.
U.S. Appl. No. 12/169,273, filed Jul. 8, 2008, Cagno, et al.
"Patented Wear Leveling", BitMicro Networks, http://www.bitmicro.com/products_edisk_features_wearlevel.php, printed Jul. 8, 2008, 2 pages.
U.S. Appl. No. 12/099,373, filed Apr. 8, 2008, Cagno et al.
"Method and Procedure to Minimize Peak Power Load During Backup of Volatile Memory with Flash Memory Devices", IBM Technical Disclosure, http://www.ip.com/pubview/IPCOM000167428D, Feb. 13, 2008, 6 pages.
Interview Summary mailed Apr. 28, 2011 for U.S. Appl. No. 12/169,273; 3 pages.
Response to Office Action filed Apr. 29, 2011, U.S. Appl. No. 12/169,273, 10 pages.
Response to Office Action filed with the USPTO on Mar. 7, 2011 for U.S. Appl. No. 12/099,373; 14 pages.
U.S. Appl. No. 12/099,373; Mar. 7, 2011, 2 pages.
U.S. Appl. No. 12/146,098; Mar. 7, 2011, 2 pages.
U.S. Appl. No. 12/169,273; Mar. 7, 2011, 2 pages.
U.S. Appl. No. 12/204,456; Mar. 7, 2011, 1 page.
Kim, Jesung et al., "A Space-Efficient Flash Translation Layer for CompactFlash Systems", IEEE Transactions on Consumer Electronics, May 2002, vol. 48, No. 2, pp. 366-375.
Thomasian, Alexander, "Priority Queueing in Raid5 Disk Arrays with an NVS Cache", Modeling, analysis, and Simulation of Computer and Telecommunication Systems, 1995. MASCOTS '95., Proceedings of the Third International Workshop on, vol., no., pp. 168-172, Jan. 18-20, 1995 doi: 10.1109/MASCOT.1995.378692.
Varma, Anujan et al., "Destage Algorithms for Disk Arrays with Nonvolatile Caches", Computers, IEEE Transactions on, vol. 47, No. 2, pp. 228-235, Feb. 1998 doi: 10.1109/12.663770, URL: http://ieeexplore.ieee.org/stamp/stamp.jsp?tp=&arnumber=663770&isnumber=14539.
Response to Office Action filed with the USPTO on May 24, 2011 for U.S. Appl. No. 12/146,098, 15 pages.
"Using Compression to Expedite Hardening Process of a Non-Volatile Memory DIMM System", IBM Technical Disclosure, http://www.ip.com/pubview/IPCOM000167472D, Feb. 15, 2008, 4 pages.
Notice of Allowability mailed Jun. 13, 2011 for U.S. Appl. No. 12/169,273, 3 pages.
Notice of Allowance mailed Jun. 9, 2011 for U.S. Appl. No. 12/169,273, 9 pages.
Office Action mailed Jun. 22, 2011 for U.S. Appl. No. 12/099,373, 12 pages.
Final Office Action mailed Jul. 28, 2011 for U.S. Appl. No. 12/146,098, 19 pages.
US 7,278,054, 10/2007, Davies et al. (withdrawn)

* cited by examiner

US 8,040,750 B2

DUAL MODE MEMORY SYSTEM FOR REDUCING POWER REQUIREMENTS DURING MEMORY BACKUP TRANSITION

BACKGROUND OF THE INVENTION

1. Field of the Invention

The present application relates generally to a dual mode memory system for reduced power requirements during memory backup transition.

2. Background of the Invention

A storage area network (SAN) is a network of storage disks. In large enterprises, a SAN connects multiple servers, or hosts, to a centralized pool of disk storage. Compared to managing hundreds of servers, each with its own disks, a SAN improves system administration. By treating all the company's storage as a single resource, disk maintenance and routine backups are easier to schedule and control. In some SANs, the disks themselves can copy data to other disks for backup without any processing overhead at the host computers.

A storage system typically comprises a plurality of storage devices and a storage controller in an enclosure. The storage controller may be a redundant array of independent disks (RAID) controller, for example. The storage controller receives host input/output (I/O) traffic to read and write data to the disk drives. The storage controller then reads data from or persists data to the disk drives via device I/O traffic. In storage systems, data is temporarily stored in volatile memory, such as Double Data Rate (DDR) Random Access Memory (RAM), due to the extremely fast access speeds that are required to meet maximum throughput to the disk drives.

BRIEF SUMMARY OF THE INVENTION

In one illustrative embodiment, a computer program product comprises a computer recordable medium having a computer readable program recorded thereon. The computer readable program, when executed on a computing device, causes the computing device to transition to memory backup mode to store data from a volatile memory to a non-volatile memory responsive to a power event, reduce power requirements for the volatile memory responsive to transitioning to memory backup mode, and store data from the volatile memory to the non-volatile memory using power provided by a hold-up voltage source.

In another illustrative embodiment, a method, in a data processing system, for reducing power requirements during memory backup transition, the method comprises transitioning to memory backup mode to store data from a volatile memory to a non-volatile memory responsive to a power event, reducing power requirements for the volatile memory responsive to transitioning to memory backup mode, and storing data from the volatile memory to the non-volatile memory using power provided by a hold-up voltage source.

In another illustrative embodiment, a memory system comprises a controller, a volatile memory, a non-volatile memory, and a hold-up voltage source. The controller is configured to detect a power event from a power supply that provides power to a storage controller and the memory system. The hold-up voltage source is configured to provide power to the memory system responsive to the power event. The controller is configured to transition to memory backup mode to store data from the volatile memory to the non-volatile memory responsive to a power event, reduce power requirements for the volatile memory responsive to transitioning to memory backup mode, and store data from the volatile memory to the non-volatile memory using power provided by a hold-up voltage source.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The illustrative embodiments provide a mechanism to reduce power requirements during memory backup transition. The mechanism reconfigures memory components and power regulation systems when a backup process is invoked. The mechanism may reduce memory output driver strength because the non-volatile memory operation domain is well constrained. The mechanism may change the differential impedance to the highest acceptable value and changes the on die termination setting to a maximum acceptable value. The mechanism may also disable receiver input circuitry in the volatile memory such that the input differential comparator network is powered down. In addition, the mechanism may disconnect the termination voltage network so that it does not present a constant power drain on the super capacitor system. The mechanism may also assert a hard reset to the storage controller when transitioning to backup mode.

Figure 1:
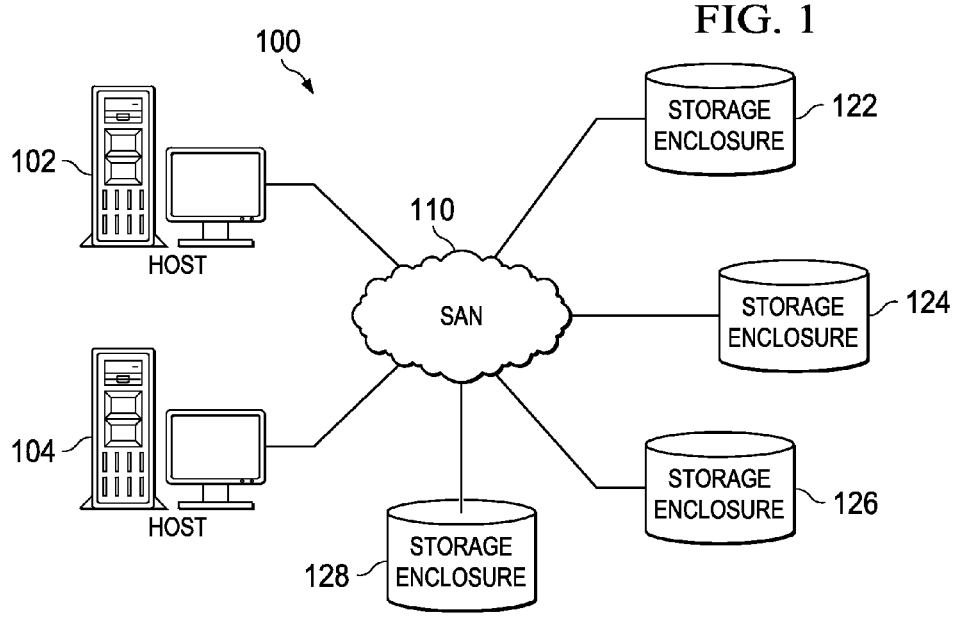
FIG. 1 depicts a pictorial representation of an exemplary distributed data processing system in which aspects of the illustrative embodiments may be implemented.
Figure 2:
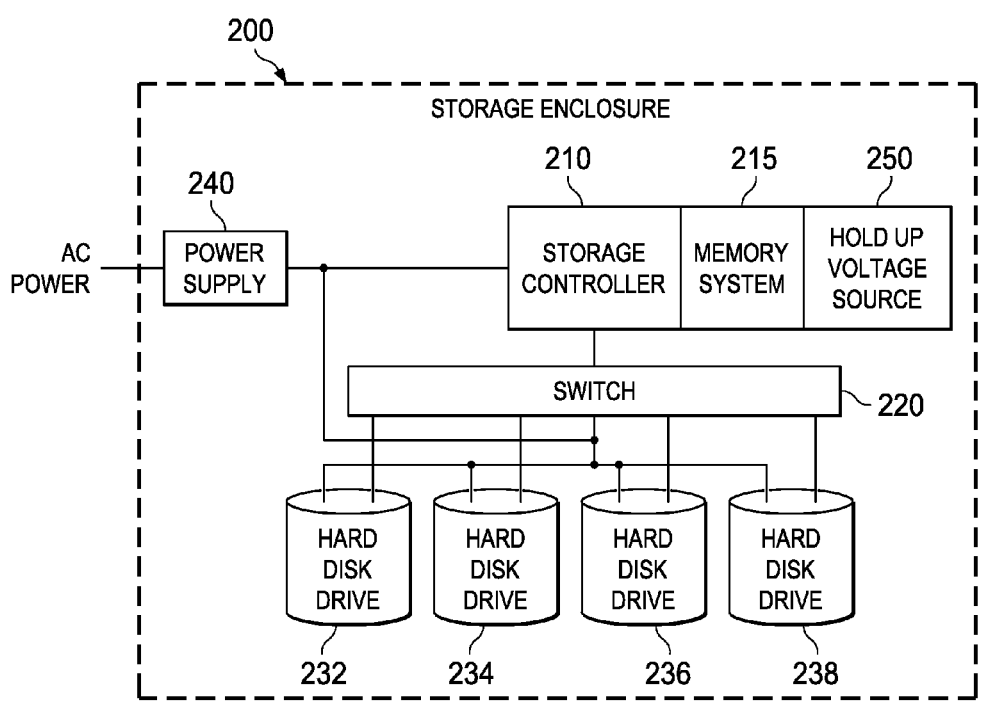
FIG. 2 is a block diagram depicting an exemplary storage enclosure in accordance with an illustrative embodiment.

The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as exemplary environments in which exemplary aspects of the illustrative embodiments may be implemented. While the description following FIGS. 1 and 2 will focus primarily on a storage enclosure implementation, this is only exemplary and is not intended to state or imply any limitation with regard to the features of the present invention. To the contrary, the illustrative embodiments are intended to include any embodiments in which a super-capacitor is used to temporarily hold up voltage for components.

With reference now to the figures and in particular with reference to FIGS. 1 and 2, exemplary diagrams of data processing environments are provided in which illustrative embodiments of the present invention may be implemented. It should be appreciated that FIGS. 1 and 2 are only exemplary and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an exemplary distributed data processing system in which aspects of the illustrative embodiments may be implemented. Distributed data processing system 100 may include a network of computers in which aspects of the illustrative embodiments may be implemented. The distributed data processing system 100 contains at least one storage area network 110, which is the medium used to provide communication links between various devices and computers, such as host computers and storage enclosures, connected together within distributed data processing system 100. Storage area network 110 may include connections, such as wire, wireless communication links, serial attached small computer systems interface (serial attached SCSI or SAS) switches, or fiber optic cables.

In the depicted example, host computer 102 and host computer 104 are connected to storage area network (SAN) 110 along with storage enclosures 122, 124, 126, and 128. A storage enclosure includes a storage controller and connection to one or more hard disk drives. The storage controller may be a simple controller for storing data to the hard disk drives, or alternatively may include a redundant array of independent disks (RAID) controller. Distributed data processing system 100 may include additional hosts, storage enclosures, clients, and other devices not shown.

In the depicted example, SAN 110 may use the Transmission Control Protocol/Internet Protocol (TCP/IP) suite of protocols to communicate with one another; however, more likely, SAN 110 may use a protocol associated with Fibre Channel (FC) or Serial attached SCSI (SAS). As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram depicting an exemplary storage enclosure in accordance with an illustrative embodiment. Storage enclosure 200 comprises storage controller 210, which may be a redundant array of independent disks (RAID) controller or a non-RAID controller. Storage controller 210 communicates with hard disk drives (HDDs) 232, 234, 236, and 238 through switch 220. Switch 220 may be, for example, a serial attached SCSI (SAS) switch. Other devices in a storage area network (SAN) may write data to or read data from storage enclosure 200 by connection to switch 220.

Storage controller 210 may store data temporarily in memory system 215 before persisting the data to HDDs 232-238. Memory system 215 may comprise a Double Data Rate (DDR) memory system that provides fast access speeds to meet required maximum throughput to HDDs 232-238. DDR memory is a volatile memory.

Power supply 240 receives alternating current (AC) power and provides direct current (DC) power to the components within storage enclosure 200. More particularly, power supply 240 provides DC power to storage controller 210, memory system 215, switch 220, and HDDs 232-238. If AC power to storage enclosure 200 is lost or interrupted, then there is a data integrity exposure within memory system 215.

One approach to solving data integrity exposure due to power failure is to hold up power to the entire enclosure using battery power while the data is written to disk. This approach requires very large and expensive uninterruptible power supply (UPS) units. Another approach involves using a small battery and placing the memory into self refresh mode. Typically, a battery may allow the volatile memory to hold data for 72 hours. Even this battery can become large and expensive. Both solutions require chemical batteries to be used, which can also create safety hazards if not used or disposed of properly.

In accordance with an illustrative embodiment, memory system 215 includes a non-volatile storage element that is used to save data from the volatile memory when power is lost and a hold up voltage source 250 that is used to hold up the voltage while the data is saved to non-volatile storage.

Figure 3:
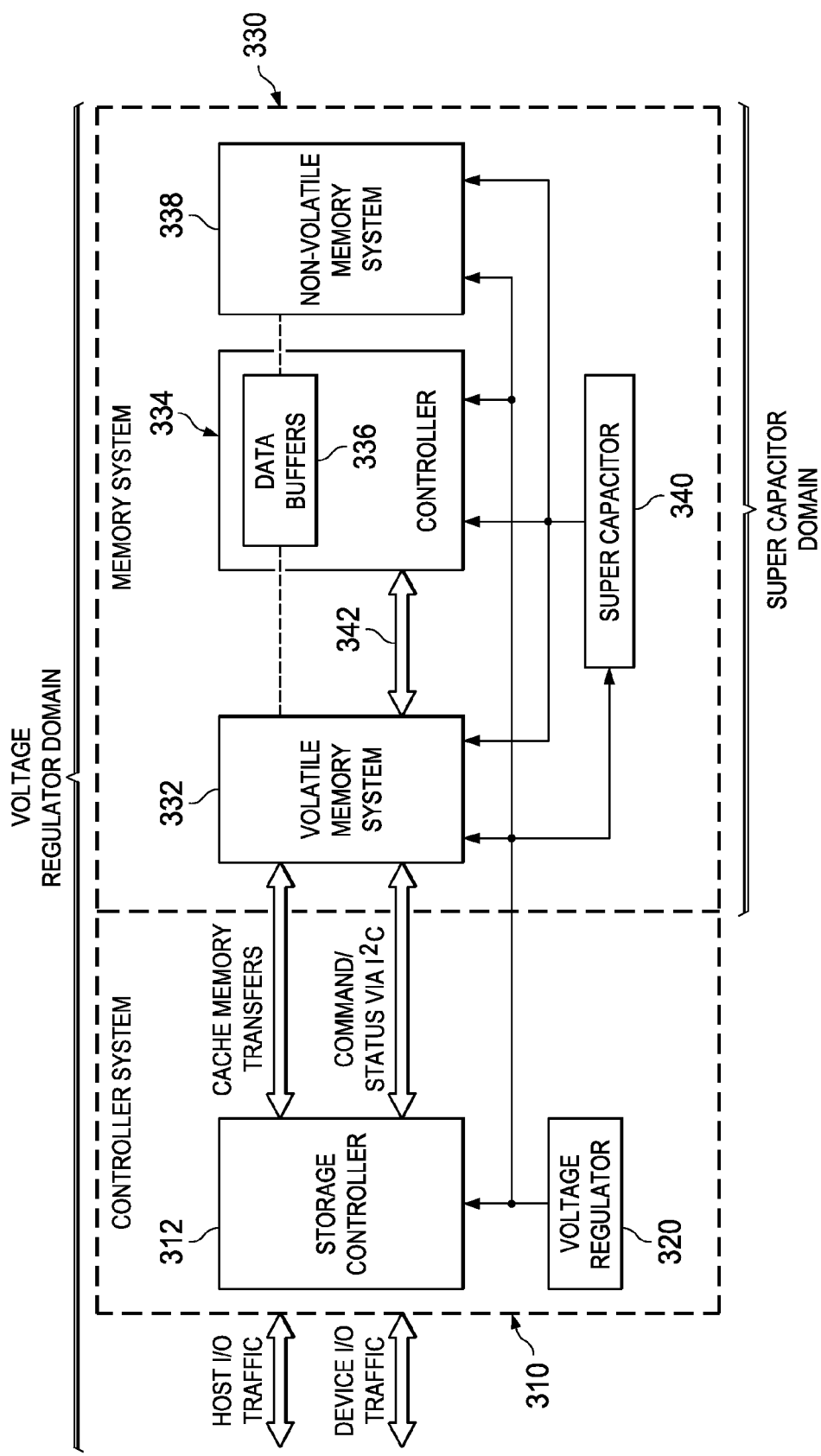
FIG. 3 is a block diagram illustrating a controller system and memory system in accordance with an illustrative embodiment.

FIG. 3 is a block diagram illustrating a controller system and memory system in accordance with an illustrative embodiment. Controller system 310 comprises storage controller 312 and voltage regulator 320. Controller system 310 receives host input/output (I/O) traffic to load data to or store data from the host. Controller system 310 also receives device I/O traffic to store data to or load data from storage devices. Storage controller 312 temporarily stores data in volatile memory system 332 within memory system 330 via cache memory transfers. Storage controller 312 also performs commands and updates status information using an inter-integrated circuit (I2C) bus.

Memory system 330 comprises volatile memory system 332, non-volatile memory system 338, controller 334, and super capacitor 340. Volatile memory system 332 may be a Double Data Rate (DDR) memory, for example. Non-volatile memory system 338 may be a flash memory, for example. Controller 334 stores data from volatile memory system 332 to non-volatile memory system 338. Controller 334 may store data temporarily in data buffers 336 as data is transferred to non-volatile memory system 338.

Voltage regulator 320 provides direct current (DC) power to storage controller 312, volatile memory system 332, controller 334, and non-volatile memory system 338. Voltage regulator 320 may provide a voltage in the range of 3.0V to 3.5V, such as 3.3V, for example. However, the voltage may be higher or lower depending on the implementation. Voltage regulator 320 also provides DC power to charge super capacitor 340 to a predetermined voltage limit. Responsive to normal power being lost from voltage regulator 320, super capacitor 340 becomes the source of power for volatile memory system 332, controller 334, and non-volatile memory system 338.

As memory system 330 hardens the data (transfers the data from volatile memory system 332 to non-volatile memory system 338), super capacitor 340 begins to discharge. At some point, the voltage provided by super capacitor 340 begins to decay as a function of the load. When the voltage of super capacitor 340 falls below the minimum voltage requirement of memory system 330, operation may become nondeterministic and failures may occur.

In accordance with an illustrative embodiment, volatile memory system 332 is a dual mode memory system for reducing power requirements during memory backup transition. As seen in FIG. 3, volatile memory system 332 is common to both the controller system 310, as a temporary storage, and memory system 330 for hardening the data from volatile memory system 332 to non-volatile memory system 338. Thus, there are two overlapping power domains: the voltage regulator domain and the super capacitor domain. The voltage regulator domain provides power to volatile memory system 332 during normal operation. The super capacitor domain provides power to volatile memory system 332 during the backup process.

During the backup process, voltage regulator 320 has no power due to the power loss event. However, as described later, the bulk capacitance of the storage controller voltage regulator domain may provide power during the backup process. The super capacitor must provide power for volatile memory system 332, controller 334, and non-volatile memory system 338, as illustrated in FIG. 3.

In accordance with an illustrative embodiment, to reduce requirements of super capacitor 340 within memory system 330, controller 334 reconfigures the memory components of volatile memory system 332 and the overlapping power domains when the backup process is invoked. In one exemplary embodiment, volatile memory system 332 is a Double Data Rate (DDR) random access memory (RAM). Controller 334 may reconfigure volatile memory system 332 by changing a number of configuration modes. Controller 334 may reconfigure volatile memory system 332 through an $I^2C$ bus 342, for example.

To reconfigure volatile memory system 332, controller 334 may reduce the memory output driver strength. The output driver strength determines how much power it takes to produce the output signal. Existing DDR memories comprise an output driver setting. For many uses of DDR memories, one typically configures the output driver strength high to ensure high power and high performance (speed). However, the operation domain of memory system 330 is well constrained. Data is transferred directly from volatile memory system 332, through data buffers 336, to non-volatile memory system 338. Point-to-point topology and shorter net lengths do not require maximum driver strength. Therefore, in this application of volatile memory system 332, controller 334 configures the output power strength to a reduced level.

Controller 334 may also change the differential impedance to the highest acceptable level. Typically, one would set the differential impedance to a low level, which enables higher performance because it enables the signal to switch faster. However, having lower differential impedance requires more power to bias normally. Low differential impedance causes a higher leakage current and requires a higher steady state current. Non-volatile memory system 338 does not store data at the high speed of which volatile memory system 332 is capable; therefore, controller 334 changes volatile memory system 332 to low power/low performance settings.

The controller 334 changes the on-die termination (ODT) setting to a maximum acceptable value. On-die terminations are single ended signals rather than differential signals that use a resistor network to power. One would typically set ODT to low level, such as 50 ohm, for example, to clean up the signal when operating at a high speed to reduce reflections. However, in the application of volatile memory system 332 in memory system 330, controller 334 sets ODT to a maximum acceptable value for steady state. An example of a maximum acceptable ODT value is 150 ohm.

A feature not yet offered by dynamic random access memory (DRAM) manufacturers is to define one of the reserved bits in the Extend Mode register to disable the receiver input circuitry such that the input differential comparator network is powered down. Thus, controller 334 may set a bit in the Extend Mode register (not shown) and disable the receiver input circuitry when invoking the backup process.

To reconfigure overlapping power domains, controller 334 may disconnect the termination voltage network so that the termination voltage network does not present a constant power drain on the super capacitor system. The termination voltage network normally is a split terminator network that presents a constant load within the volatile memory system 332. The termination voltage network is generally used to improve signal integrity in volatile memory systems that have multiple loads. During the backup process, memory system 330 has a point-to-point load and can therefore tolerate no termination voltage network.

Figure 4:
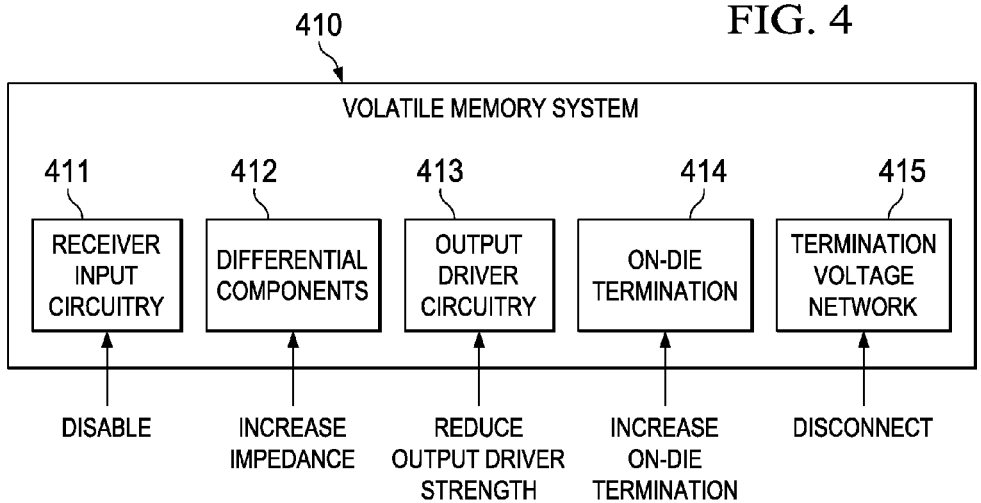
FIG. 4 is a block diagram illustrating components of the volatile memory system in accordance with an illustrative embodiment.

FIG. 4 is a block diagram illustrating components of the volatile memory system in accordance with an illustrative embodiment. Volatile memory system 410 comprises receiver input circuitry 411, differential components 412, output driver circuitry 413, on-die termination circuitry 414, and termination voltage network 415. As described above, when invoking the backup process, the memory system controller invokes a plurality of power saving techniques.

More particularly, the memory system controller may disable the receiver input circuitry 411 such that the input differential comparator network is powered down. The memory system controller may also increase the differential impedance for differential components 412 to the highest acceptable value. In addition, the memory system controller may reduce output driver strength for output driver circuitry 413 because during the backup process volatile memory system 410 does not require maximum driver strength. Furthermore, the memory system controller may change the on-die termination setting for on-die termination circuitry 414 to a maximum value. Still further, the memory system controller may disconnect the termination voltage network 415 because during the backup process the termination voltage network 415 is not necessary.

Figure 5:
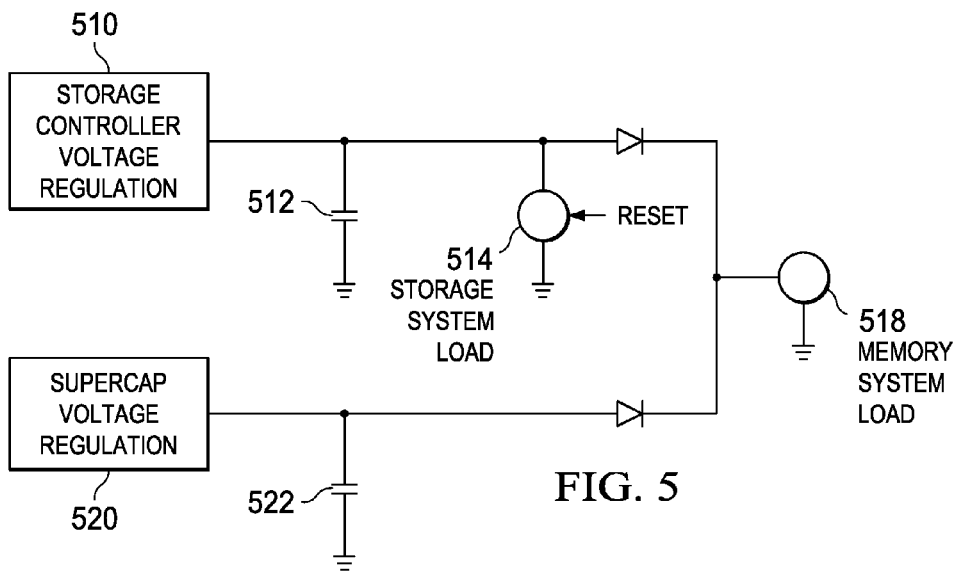
FIG. 5 illustrates the overlapping voltage domain for a memory system in accordance with an illustrative embodiment.

FIG. 5 illustrates the overlapping voltage domain for a memory system in accordance with an illustrative embodiment. As shown in FIG. 5, storage controller voltage regulation 510 powers storage system load 514. Storage controller voltage regulation 510 has a capacitance 512. In other words, even after alternating current (AC) power is lost, capacitance 512 allows storage controller voltage regulation 510 to provide power to storage system load 514.

Super capacitor voltage regulation 520 and storage controller voltage regulation 510 provide power to memory system load 518. Thus, when storage controller voltage regulation 510 ceases providing power, supercap voltage regulation 520 provides power to memory system load 518 to perform the backup process. Supercap voltage regulation 520 has capacitance 522. Supercap voltage regulation 520 may provide power to memory system load 518 as long as capacitance 522 provides sufficient voltage.

In accordance with an illustrative embodiment, the memory system controller may assert a hard reset to the storage controller system when transitioning to backup mode. Performing a reset of storage system load 514 significantly reduces the load and allows storage controller voltage regulation 510, including capacitance 512, to continue to provide holdup power to memory system load 518 during the backup process. Thus, performing a reset on storage system load 514 allows memory system load 518 to scavenge any remaining capacity within the normal storage controller voltage regulation 510 boundary.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
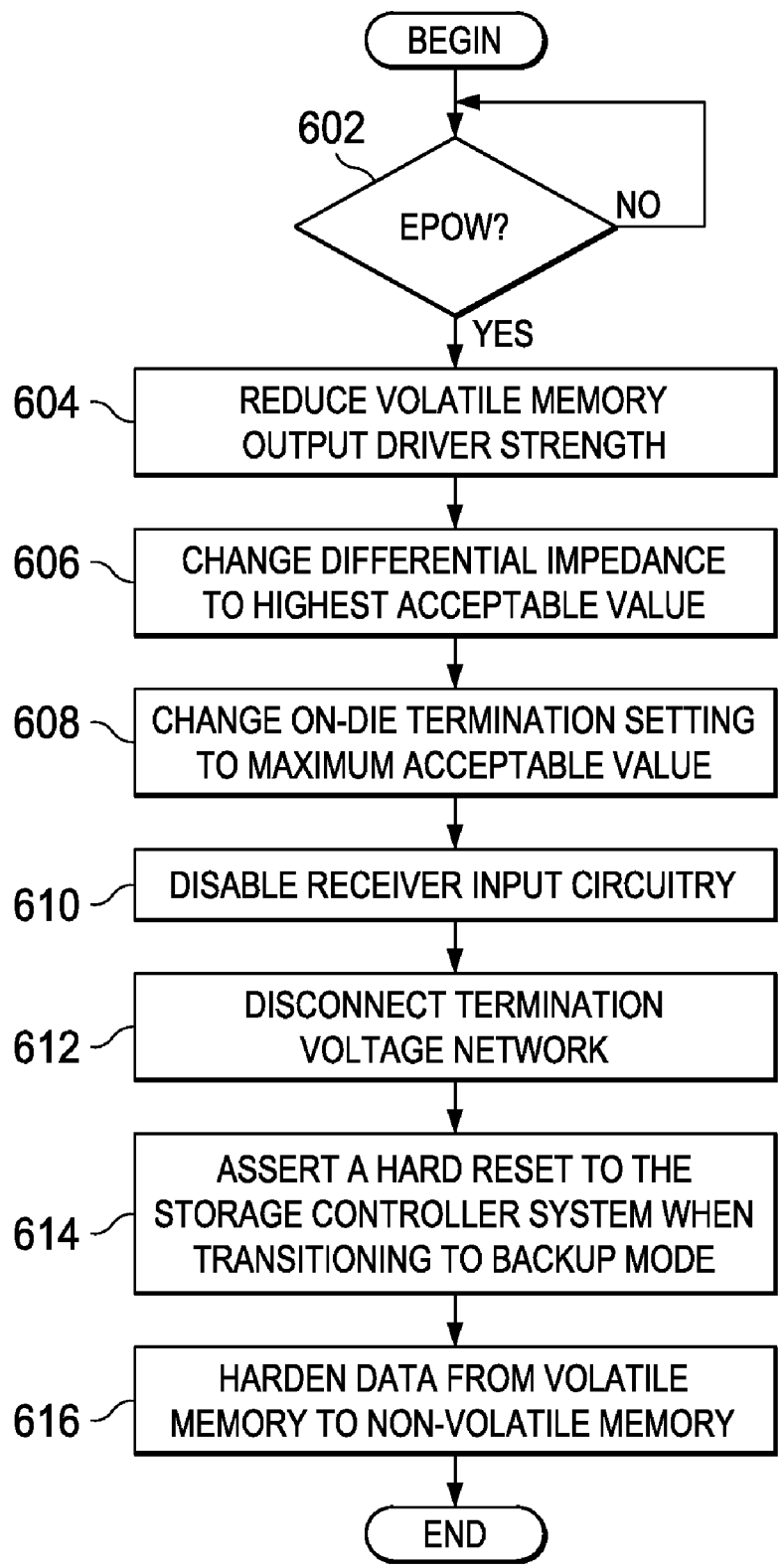
FIG. 6 is a flowchart illustrating operation of a memory system to reduce power requirements during memory backup transition in accordance with an illustrative embodiment.

FIG. 6 is a flowchart illustrating operation of a memory system to reduce power requirements during memory backup transition in accordance with an illustrative embodiment. Operation begins, and the controller determines if there is an early power off warning (EPOW) (block 602). If there is not an early power off warning, then operation returns to block 602 until an early power off warning is received.

If an early power off warning message has been received from the storage controller in block 602, the controller reduces output driver strength for the volatile memory system (block 604). The controller also changes the differential impedance to the highest acceptable value in the volatile memory system (block 606). The controller changes the on-die termination setting in the volatile memory system to a maximum acceptable value (block 608). The controller also disables receiver input circuitry (block 610) and disconnects the termination voltage network (block 612).

The controller also asserts a hard reset to the storage controller system when transitioning to the backup mode (block 614). Then, the controller hardens data from the volatile memory to the non-volatile memory (block 616). Thereafter, operation ends.

Thus, the illustrative embodiments provide mechanisms for reducing power requirements during memory backup transition. When transitioning to backup mode, the memory system controller performs a number of power saving techniques. The controller may change a number of configuration settings in the volatile memory system, such as reducing output driver strength, increasing differential impedance, increasing on-die termination, disabling receiver input circuitry, and disconnecting the termination voltage network. The controller may also assert a hard reset to the storage controller system to significantly reduce the load and allow the voltage regulator to continue to provide power to the memory system for a longer period of time.

As noted above, it should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a non-transitory computer readable storage medium having a computer readable program recorded thereon, wherein the computer readable program, when executed on a computing device, causes the computing device to:
   transition to memory backup mode to store data from a volatile memory to a non-volatile memory responsive to a power event;
   reduce power requirements for the volatile memory responsive to transitioning to memory backup mode; and
   store data from the volatile memory to the non-volatile memory using power provided by a hold-up voltage source, wherein reducing power requirements for the volatile memory comprises at least one of:
   changing differential impedance within the volatile memory to a maximum acceptable value;
   changing on-die termination within the volatile memory to a maximum acceptable value;
   powering down an input differential comparator network of the volatile memory; or
   disconnecting a termination voltage network of the volatile memory.

2. The computer program product of claim 1, wherein reducing power requirements for the volatile memory further comprises:
   reducing output driver strength for the volatile memory.

3. The computer program product of claim 1, wherein reducing power requirements for the volatile memory comprises:
   changing differential impedance within the volatile memory to a maximum acceptable value.

4. The computer program product of claim 1, wherein reducing power requirements for the volatile memory further comprises at least one of:
   changing on-die termination within the volatile memory to a maximum acceptable value
   powering down an input differential comparator network of the volatile memory; or
   disconnecting a termination voltage network of the volatile memory.

5. The computer program product of claim 4, wherein disconnecting a termination voltage network of the volatile memory comprises:
   disabling receiver input circuitry within the volatile memory.

6. The computer program product of claim 1, wherein the data processing system comprises a controller system having a power supply, a storage controller, and a memory system, wherein the memory system comprises the volatile memory and the non-volatile memory, wherein the power supply provides power to the storage controller and the memory system, wherein the memory system comprises the hold-up voltage source, wherein the hold-up voltage source provides power to the memory system responsive to the power event, and wherein the computer readable program further causes the computing device to:
   assert a reset to the storage controller responsive to transitioning to memory backup mode.

7. A method, in a data processing system, for reducing power requirements during memory backup transition, the method comprising:
   responsive to a power event, transitioning to memory backup mode to store data from a volatile memory to a non-volatile memory;
   responsive to transitioning to memory backup mode, reducing power requirements for the volatile memory; and
   storing data from the volatile memory to the non-volatile memory using power provided by a hold-up voltage source, wherein reducing power requirements for the volatile memory comprises at least one of:
   changing differential impedance within the volatile memory to a maximum acceptable value;
   changing on-die termination within the volatile memory to a maximum acceptable value;
   powering down an input differential comparator network of the volatile memory; or
   disconnecting a termination voltage network of the volatile memory.

8. The method of claim 7, wherein reducing power requirements for the volatile memory further comprises:
   reducing output driver strength for the volatile memory.

9. The method of claim 7, wherein reducing power requirements for the volatile memory comprises:

changing differential impedance within the volatile memory to a maximum acceptable value.

10. The method of claim 7, wherein reducing power requirements for the volatile memory further comprises at least one of:

changing on-die termination within the volatile memory to a maximum acceptable value powering down an input differential comparator network of the volatile memory; or disconnecting a termination voltage network of the volatile memory.

11. The method of claim 10, wherein disconnecting a termination voltage network of the volatile memory comprises:

disabling receiver input circuitry within the volatile memory.

12. The method of claim 7, wherein the data processing system comprises a controller system having a power supply, a storage controller, and a memory system, wherein the memory system comprises the volatile memory and the non-volatile memory, wherein the power supply provides power to the storage controller and the memory system, wherein the memory system comprises the hold-up voltage source, and wherein the hold-up voltage source provides power to the memory system responsive to the power event.

13. The method of claim 12, further comprising:

responsive to transitioning to memory backup mode, asserting a reset to the storage controller.

14. The method of claim 7, wherein the hold-up voltage source is a super capacitor.

15. The method of claim 7, wherein the power event is an early power off warning.

16. A memory system comprising:

a controller, wherein the controller is configured to detect a power event from a power supply that provides power to a storage controller and the memory system;

a volatile memory;

a non-volatile memory; and a hold-up voltage source, wherein the hold-up voltage source is configured to provide power to the memory system responsive to the power event, wherein the controller is configured to transition to memory backup mode to store data from the volatile memory to the non-volatile memory responsive to a power event, reduce power requirements for the volatile memory responsive to transitioning to memory backup mode, and store data from the volatile memory to the non-volatile memory using power provided by a hold-up voltage source, wherein reducing power requirements for the volatile memory comprises at least one of:

changing differential impedance within the volatile memory to a maximum acceptable value;

changing on-die termination within the volatile memory to a maximum acceptable value;

powering down an input differential comparator network of the volatile memory; or disconnecting a termination voltage network of the volatile memory.

17. The memory system of claim 16, wherein reducing power requirements for the volatile memory further comprises at least one of reducing output driver strength for the volatile memory or disconnecting a termination voltage network of the volatile memory by disabling receiver input circuitry within the volatile memory.

18. The memory system of claim 16, wherein the controller is configured to assert a reset to the storage controller responsive to transitioning to memory backup mode.

19. The memory system of claim 16, wherein the hold-up voltage source is a super capacitor.

20. The memory system of claim 16, wherein the power event is an early power off warning.

* * * * *